United States Patent [19]

Tellam

[11] Patent Number: 4,842,527

[45] Date of Patent: Jun. 27, 1989

[54] CONTACT ASSEMBLY FOR INTERCONNECTING CIRCUIT BOARD AND A COAXIAL CONNECTOR

[75] Inventor: Mark E. Tellam, Parkland, Fla.

[73] Assignee: Motorola, Inc., Schaumburg, Ill.

[21] Appl. No.: 282,869

[22] Filed: Dec. 9, 1988

Related U.S. Application Data

[63] Continuation of Ser. No. 80,026, Jul. 31, 1987, abandoned.

[51] Int. Cl.⁴ ........ H05K 1/00

[52] U.S. Cl. ........ 439/63; 439/76; 439/581

[58] Field of Search ........ 439/55, 63, 76, 80, 439/81, 578–585; 333/245, 246, 260, 261

[56] References Cited

U.S. PATENT DOCUMENTS

| | | | |
|---|---|---|---|
| 3,179,912 | 4/1965 | Huber et al. | 439/63 |
| 3,201,722 | 8/1965 | May et al. | 333/84 |
| 3,258,735 | 6/1966 | Valle | 439/581 |
| 3,445,803 | 5/1969 | Johnston et al. | 439/76 |
| 3,915,535 | 10/1975 | O'Keefe et al. | 439/63 |
| 3,969,728 | 7/1976 | Hodsdon et al. | 343/702 |
| 4,015,070 | 3/1977 | Theurer | 439/76 |
| 4,116,523 | 9/1978 | Coberly et al. | 439/607 |
| 4,431,253 | 2/1984 | Hochgesang et al. | 439/63 |
| 4,636,015 | 1/1987 | Ford, Jr. | 339/14 R |
| 4,718,853 | 1/1988 | Orbanic | 439/76 |

*Primary Examiner*—David Pirlot
*Attorney, Agent, or Firm*—Daniel K. Nichols

[57] ABSTRACT

A contact assembly is provided for interconnecting a circuit board and a coaxial connector. A formed metal element provides a strip of electrically conductive material which is connected to and supported by the circuit board. A center contact arm extends from the strip to engage the coaxial connector. A second formed metal element includes a ground plane which is supported by the circuit board in spaced relation to the strip. A ground contact arm extends from the ground plane to engage the coaxial connector. A dielectric member is positioned between the strip and the ground plane.

2 Claims, 2 Drawing Sheets

CONTACT ASSEMBLY FOR INTERCONNECTING CIRCUIT BOARD AND A COAXIAL CONNECTOR

This is a continuation of application Ser. No. 080,026, filed July 31, 1987 and now abandoned.

BACKGROUND OF THE INVENTION

This invention relates generally to a contact assembly for connecting a circuit board and a coaxial connector, and in particular to one in which a microstrip or stripline configuration is utilized.

In RF devices, such as portable two-way radios, it is often necessary to provide an electrical RF connection between a printed circuit board that is located within a housing and a coaxial connector mounted on the housing. The interconnection is required to present the proper impedance between the circuit board and the coaxial connector.

One approach to this problem is to utilize coaxial cable, such as miniature coaxial cable which is solder to both the circuit board and the coaxial connector. This approach has several drawbacks. First of all, soldering of coaxial cables is inherently a manual operation that does not lend itself to automation and it is consequently both more time consuming and more costly to manufacture a device utilizing this approach. Additionally, the connection is semi-permanent, that is it requires unsoldering to disconnect the circuit board from the coaxial connector. This inhibits the removal and the insertion of the circuit board from the housing. One well known alternative approach involves the use of inline coaxial connector. The ends of the coaxial cable are soldered to the coaxial connector and the circuit board and the inline connector is used to allow connection and removal of the circuit board from the housing. This approach still requires manual soldering of the coaxial cables as well as the manual connection of the inline connector.

Another approach to interconnection of a circuit board and a coaxial connector is disclosed in U.S. Pat. No. 4,690,461, entitled, "RF Interconnect with Triaxial SelfAlignment", assigned to the assignee of the present patent invention, the disclosure of which is incorporated by reference as if fully set out herein. This approach utilized a formed wire to accommodate tolerance variations in contacting a center pin of a coaxial connector.

It is desirable that a contact assembly be mounted directly to the circuit board and provide automatic connection of the circuit board to the coaxial connector without any manual operation other than the insertion of the circuit board into the housing, while providing proper the impedance for the RF connection.

SUMMARY OF THE INVENTION

This contact assembly is mountable to a circuit board and includes contact means for engaging a coaxial connector for providing electrical connection thereto.

The contact assembly for interconnecting a circuit board and a coaxial connector includes a center contact means. This center contact means includes a strip of electrically conductive material, means for electrically connecting and supporting the strip from the circuit board, and a center contact arm extending from the strip for selectively engaging the coaxial connector. A ground contact means includes a ground plane of electrically conductive material spaced from the strip, means electrically connecting and supporting the ground plane from the circuit board, and a ground plane contact arm extending from the ground plane for selectively engaging the coaxial connector. Dielectric means are positioned between the strips and the ground plane.

In an aspect of the invention, the strip and ground plane constitute a microstrip. In another aspect of the invention, the center contact means comprises a formed metal element. In still another aspect of the invention, the ground contact means comprises a formed metal element.

In yet another aspect of the invention, the dielectric means includes an intermediate wall between the strip and the ground plane. An end wall is attached to the intermediate wall and the contact arms extend over the end wall. In another aspect of the invention, the dielectric means includes two outside walls positioned with the strip being positioned between the intermediate wall and one outside wall and the ground plane being positioned between the intermediate wall and the other outside wall.

DESCRIPTION OF THE PREFERRED EMBODIMENT

Figure 1:
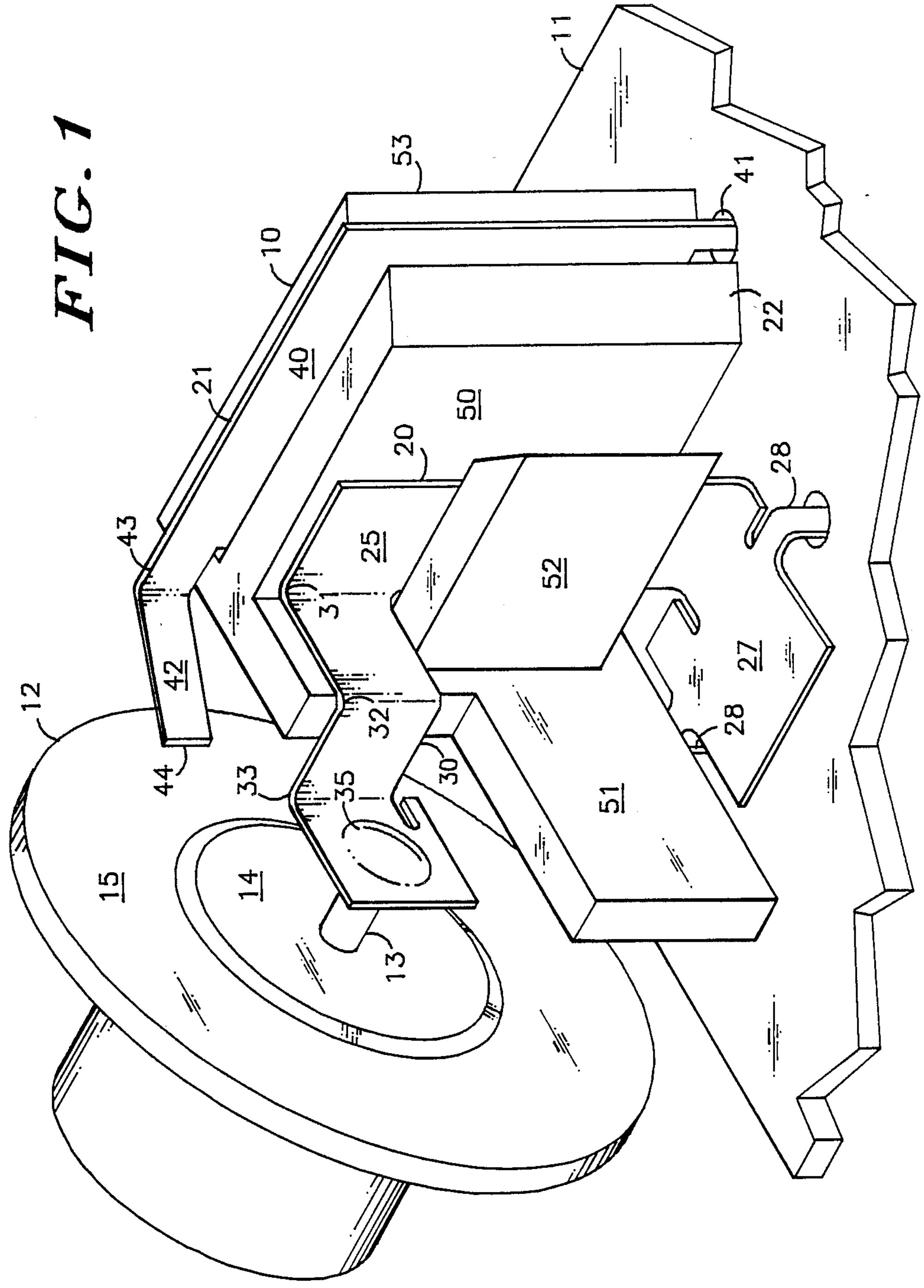
FIG. 1 is a perspective view of a contact assembly in accordance to the present invention.

Referring now by characters of reference to the drawings and first to FIG. 1, it will be understood that the contact assembly 10 is mounted to and carried by a circuit board 11. The contact assembly 10 is designed to interconnect the circuit board 11 to a coaxial connector 12. The coaxial 12 can be mounted through a wall of a housing (not shown) in which the circuit board 11 is carried. The coaxial connector 12 includes a center pin or contact 13 that in the preferred embodiment would extend into the interior of the housing for engagement with the contact assembly 10. About the pin 13 is insulator of dielectric material 14 which is in turn surrounded by a coaxial ground contact 15 which provides the other contact point for the contact assembly 10.

The contact assembly 10 includes a formed metal element 20, comprising center contact means, a second form metal element 21 comprising ground contact means, and a dielectric member 22 comprising dielectric means which is positioned between the form metal elements 20 and 21.

The formed element 20 includes a strip or strip portion 25 that extends substantially from the circuit board 11, a foot portion 26 is connected to the strip portion 25 adjacent to the circuit board 11. The foot portion 26, constituting means for electrically connecting and supporting the strip portion 25, includes a flat planer portion 27 that lies in engagement with the circuit board 11 and provides a stable base for the formed metal portion 20. Foot portion 26 also includes tabs 28 that extend through the circuit board 11 and are soldered (not shown) to the circuit traces of the circuit board 11 in a conventional manner.

A center contact arm 30 extends from the end of a strip portion 25 that is spaced from the circuit board 11 for providing electrical contact to the center pin 13 of the coaxial connector 12. In the preferred embodiment, the center contact arm 30 includes several bends. As is viewed in FIG. 1, there is a left hand bend 31 at the connection of the contact arm 30 to the strip 25, spaced from that bend a right hand bend 32, and spaced from that bend is another left hand bend 33. The center contact arm 30 includes at its far end a contact area 35, which in the preferred embodiment presents a concave surface for engagement with the center pin 30 of coaxial connector 12. The center contact arm 30 with its various bends 31, 32, and 33 provides a resiliently flexible spring arrangement for engaging the center pin 13.

The second formed element 21 includes a ground plane portion 40 that is positioned in spaced relation to the strip portion 25. Tabs such as a tab 41 shown in FIG. 1 are received through the circuit board 11 for soldering to the printed circuit board 11 in a conventional manner, and provide means electrically and mechanically supporting the ground plane portion 40. The ground plane portion 40 extends from the printed circuit board 11 and, at an end spaced from the circuit board 11, a ground contact arm 42 extends from the ground plane portion for selectively engaging the ground contact 15 of the coaxial connector 12. The ground contact arm 42 includes a partial left hand bend 43 and its far end 44 spaced from the ground plane 40 selectively, engages the coaxial connector of portion 15.

The dielectric member 22 is utilized to provide the desired impedance for the contact assembly 10 in conjunction with the formed elements 20 and 21 and further serves as an electrical insulator. The dielectric member 22 which in the preferred embodiment is molded of polypropylene includes an intermediate wall 50 that is positioned between the strip 25 and ground plane 40. The wall 50 is connected to and supported by an end wall 51. Arms 30 and 40 extend over the end wall 51 to contact the coaxial connector 12. The wall 51 also supports an outside wall 52 adjacent to the outside of the strip 25 and an outside wall 53 adjacent to the outside of the ground plane portion 40.

It is thought that the structural features and functional advantages of the contact assembly have become fully apparent from the foregoing description of parts, but for completeness of disclosure, a brief description of the operation and use of the contact assembly will be given.

In use the formed metal element 20 is positioned on a circuit board 11 and the tabs 28 are soldered to the board. The second formed metal element 21 is also positioned on the circuit board 11 and its tabs 41 is also soldered to the board. The dielectric member 22 is positioned about the formed metal elements 20 and 21. If desired, the dielectric member 22 can be attached as by an adhesive to the circuit board 11. Alternatively, it can be constrained solely by the boundaries of any housing and receives the circuit board 11.

Figure 2:
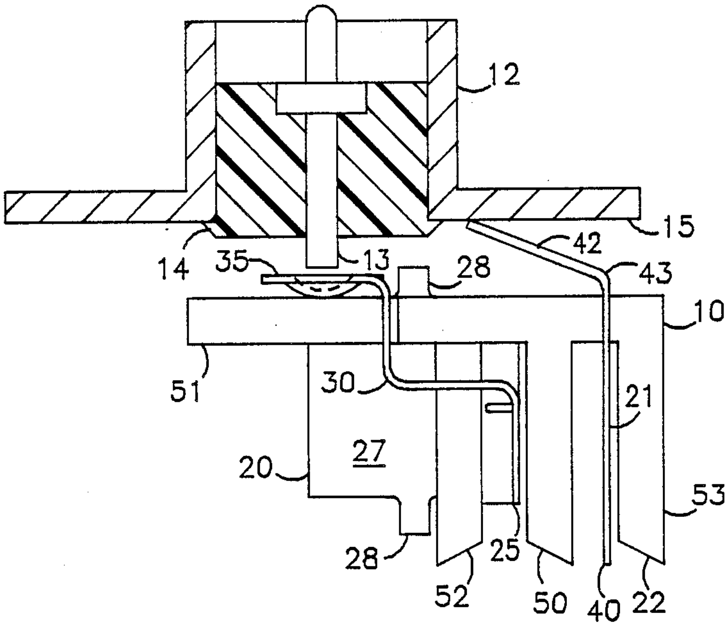
FIG. 2 is a top plan view, partially in cross section, of the contact assembly of FIG. 1.

In FIG. 2 the coaxial connector 12 and contact assembly 10 are illustrated. The ground contact arm 42 can engage the coaxial ground contact 15 prior to engagement of the center contact arm 35 with the center pin 13. As the contact assembly 10 is moved further toward the connector 12, ground contact arm flexes or bends. Likewise, center contact arm 30 also flexes or bends after engaging center pin 13.

While the strip 25 and ground plane 40 form a microstrip, if desired, the ground plane 40 could be extended to wrap around the outside wall 52, thereby providing a stripline construction.

The circuit board 11 is then mounted in a position such as within a housing where the center contact arm 32 and ground contact arm 42 have been brought into engagement with the appropriate contacts of the coaxial connector 12. The center contact arm 30 and ground contact arm 42 resiliently bend or flex in order to provide spring type contact with the coaxial connector 12. The spring type contacts assuring a good electrical connection and allowing for manufacturing variations in dimensions.

I claim as my invention:

1. A contact assembly for interconnecting a circuit board located within a housing and a coaxial connector mounted on the housing comprising:
   a center contact means, constituting a formed metal element, including a strip of electrically conductive material, means for electrically connecting and supporting the strip on the circuit board, and a resiliently flexible center contact arm extending from the strip for selectively engaging the coaxial connector;
   a ground contact means, constituting a formed metal element, including a ground plane of electrically conductive material, means for electrically connecting and supporting the ground plane from the circuit board in spaced relation to the strip, and a resiliently flexible ground contact arm extending from the ground plane for selectively engaging the coaxial connector, and
   dielectric means including an intermediate wall positioned between the strip and the ground plane,
   wherein the strip and the ground plane comprise a microstrip.
2. A contact assembly as defined in claim 1, in which:
   the dielectric means further includes an end wall attached to the intermediate wall and two outside walls, one positioned adjacent to the strip and the other adjacent to the ground plane, the outside walls being supported by the end wall.

* * * * *